(12) United States Patent
Kanemoto (10) Patent No.: US 7,425,495 B2
(45) Date of Patent: Sep. 16, 2008

(54) METHOD OF MANUFACTURING SEMICONDUCTOR SUBSTRATE AND SEMICONDUCTOR DEVICE

(75) Inventor: Kei Kanemoto, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 123 days.

(21) Appl. No.: 11/639,015

(22) Filed: Dec. 14, 2006

(65) Prior Publication Data
US 2007/0138553 A1 Jun. 21, 2007

(30) Foreign Application Priority Data
Dec. 15, 2005 (JP) .............................. 2005-361451

(51) Int. Cl.
*H01L 21/76* (2006.01)
(52) U.S. Cl. ...................... 438/424; 438/404; 438/407; 438/426
(58) Field of Classification Search ................. 438/407, 438/404, 413, 426, 424, 412; 257/347
See application file for complete search history.

(56) References Cited
FOREIGN PATENT DOCUMENTS

| JP | 2000-124092 A | 4/2000 |
|----|---------------|--------|
| JP | 2002-299591 A | 10/2002 |
| JP | 2006-100681 A | 4/2006 |
| JP | 2006-108206 A | 4/2006 |
| JP | 2006-210683 A | 8/2006 |

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

*Primary Examiner*—Tom Thomas
*Assistant Examiner*—Valerie Brown
(74) *Attorney, Agent, or Firm*—AdvantEdge Law Group, LLC (57) ABSTRACT

A method of manufacturing a semiconductor substrate and semiconductor device is disclosed and comprises forming a first monocrystalline semiconductor layer on a semiconductor base material, forming a second monocrystalline semiconductor layer covering the first monocrystalline semiconductor layer, and forming a support hole exposing the semiconductor base. A support layer is formed on the active surface of the semiconductor base material to fill the support hole and covers the second polycrystalline semiconductor layer. A cavity is formed between the second monocrystalline semiconductor layer and the semiconductor base material by selectively etching the first monocrystalline semiconductor layer through the opening surface. A buried insulating layer is formed in the cavity. A planarizing layer is formed on the semiconductor base material and planarized using the second polycrystalline semiconductor layer as an etch stop layer. The second polycrystalline semiconductor layer and the first polycrystalline semiconductor layer are removed.

5 Claims, 5 Drawing Sheets

METHOD OF MANUFACTURING SEMICONDUCTOR SUBSTRATE AND SEMICONDUCTOR DEVICE

BACKGROUND OF THE INVENTION

1. Technical Field

The present invention relates to a method of manufacturing a semiconductor substrate and a semiconductor device, and more particularly to a technique of forming an silicon on insulator (SOI) layer on a semiconductor substrate.

2. Related Art

A transistor formed on an SOI substrate has great advantages such as reducing the power consumption and increasing the operation speeds of the semiconductor device, because the transistor has a smaller junction capacitance (capacitance between a source/drain region and a substrate) than that of a transistor formed on a bulk silicon substrate.

In general, an SOI substrate including an SOI layer formed over the entire surface of a bulk silicon substrate is prepared, and transistors are subsequently formed on the SOI layer while the unnecessary portion of the SOI layer is removed.

Examples of methods to form an SOI substrate include: forming an SOI substrate by using a bonding technique as disclosed in JP-A-2002-299591, a first related art example; and forming an SOI substrate by using a separation by implanted oxygen (SIMOX) technique disclosed in JP-A-2000-124092, a second relate art example.

T. Sakai et al., Second International SiGe Technology and Device Meeting, Meeting Abstract, pp. 230-231, May (2004), is a third related art example.

The example discloses a SBSI (Separation by Bonding Si Islands) method, which partially forms an SOI layer on a bulk silicon substrate, allowing low-cost manufacture of SOI transistors.

In this method of forming an SOI layer on a bulk silicon substrate, a silicon germanium (SiGe) layer and a silicon (Si) layer are grown epitaxially on the silicon substrate, and then holes for forming a support (support hole) are formed through the layers.

A silicon oxide layer or the like, which is to become a support, is formed over the holes.

Then, in order to form an element region, portions of the silicon oxide layer, the silicon layer and the silicon germanium layer located in the vicinity the element region are dry etched away.

Further, when the silicon germanium layer is selectively etched with fluoro-nitric acid, a cavity is formed under the silicon layer that is supported by the support.

By burying in the cavity an insulating layer made of silicon oxide or the like, a buried oxide (BOX) layer is formed between the silicon substrate and the silicon layer.

A silicon oxide layer is then deposited on the silicon substrate.

Subsequently, the surface of the substrate is planarized by a CMP (Chemical-Mechanical Polishing) method or the like to make uniform the thickness of the silicon oxide layer located on the SOI layer, and then the SOI layer is exposed by using buffered fluoric acid or the like.

Thus the SOI layer is provided on the bulk silicon substrate.

Manufacturing a bonded substrate using the above-mentioned technique disclosed in the first related art example requires bonding two silicon substrates to each other and then polishing the surface of the silicon wafer.

It is therefore difficult to precisely control the thickness of a thin semiconductor layer the SOI structure has.

There is also a problem such that the price of the SOI substrate becomes higher than that of the bulk silicon substrate due to the bonding and polishing processes.

Manufacturing an SIMOX substrate using the above-mentioned technique disclosed in the second related art example requires ion implantation of oxygen of high concentration into a silicon wafer.

As a result, damage caused by the ion implantation can remain in the SOI substrate.

There is also a problem such that the ion implantation of oxygen of high concentration reduces the throughput of the SOI substrate and makes the price higher than that of the bulk silicon substrate.

In the method disclosed in the third related art example, a BOX layer is formed as described above and then a silicon oxide layer is deposited on a silicon substrate.

Subsequently, the substrate surface is planarized by etching the silicon oxide layer using a CMP method or the like, and then is etched with buffered fluoric acid or the like, exposing an SOI layer.

If a CMP method or the like of planarizing a substrate surface is used at this point, it is difficult to control the etching amount in the planarization process of the CMP method or the like without an etch stop layer that serves the control of the etching amount.

If the etching amount is excessive, etching of the CMP method or the like reaches the SOI layer, causing damage to the SOI layer.

If the etching amount is insufficient, the remaining silicon oxide layer on the SOI layer is thick.

This may cause the silicon oxide layer to remain in the process of exposing the SOI layer by etching the silicon oxide layer with a buffered fluoric acid or the like.

There is therefore a problem of deviation in gate film thickness of transistors and defects resulting therefrom, for example.

SUMMARY

An advantage of the present invention is to provide a method of manufacturing a semiconductor substrate and a semiconductor device in which precise control of the etching amount in a CMP method or the like is enabled to prevent damage caused to the SOI layer by the planarization process and, after the planarization process, the SOI layer can be exposed with good control by using a buffered fluoric acid or the like.

A method of manufacturing a semiconductor substrate according to one aspect of the invention includes: forming a first mono crystalline semiconductor layer in a portion having a mono crystalline area exposed on an active surface side of a mono crystalline semiconductor base material, the first mono crystalline semiconductor layer being made of a mono crystalline material having an etching selectivity greater than that of the semiconductor base material, and simultaneously forming a first polycrystalline semiconductor layer in a portion where a coated material has been formed in the mono crystalline area, the first polycrystalline semiconductor layer being made of a polycrystalline material; forming a second mono crystalline semiconductor layer in an area covering the first mono crystalline semiconductor layer, the second mono crystalline semiconductor layer being made of a mono crystalline material having an etching selectivity less than that of the material of the first mono crystalline semiconductor layer, and simultaneously forming a second polycrystalline semiconductor layer in an area covering the first polycrystalline semiconductor layer, the second polycrystalline semiconductor layer being made of a polycrystalline material; forming a support hole exposing the semiconductor base by partially removing and opening the second mono crystalline semiconductor layer and the first mono crystalline semiconductor layer located in vicinity of an element region formed of part of the second mono crystalline semiconductor layer; forming a support forming layer on the active surface side of the semiconductor base material so as to fill the support hole and the element region and to cover the second polycrystalline semiconductor layer; performing etching, leaving behind at least part of the second polycrystalline semiconductor layer serving as an etch stop layer, and the support hole and the element region, thereby forming an opening surface to expose the support and part of an end of the first mono crystalline semiconductor layer and part of an end of the second mono crystalline semiconductor layer, the first mono crystalline semiconductor layer and the second mono crystalline semiconductor layer being positioned between the semiconductor base material and the support; forming a cavity between the second mono crystalline semiconductor layer constituting the element region and the semiconductor base material by selectively etching the first mono crystalline semiconductor layer through the opening surface; forming a buried insulating layer in the cavity; forming a planarizing insulating layer on the active surface side of the semiconductor base material; planarizing the active surface side of the semiconductor base material using the second polycrystalline semiconductor layer as an etch stop layer and thereafter exposing the second mono crystalline semiconductor layer; and removing the second polycrystalline semiconductor layer and the first polycrystalline semiconductor layer.

This manufacturing method of a semiconductor substrate leaves behind at least part of the second polycrystalline semiconductor layer that serves as an etch stop layer, allowing precise control of the etching amount. It is therefore possible to suppress damage to the second mono crystalline semiconductor layer that is caused by excessive etching or undesirable exposure of the second mono crystalline semiconductor layer that is caused by insufficient etching, when planarizing an insulating layer after formation thereof.

In the above-mentioned method, it is preferable that a method of the planarizing be a CMP (chemical-mechanical polishing) method and use the second polycrystalline semiconductor layer as an etch stop layer.

The method leaves behind at least part of the second polycrystalline semiconductor layer that serves as an etch stop layer in the CMP method.

In planarization by the CMP method, the presence of an etch stop layer allows the thickness of the remaining layer to be controlled with high reproducibility.

In the above-mentioned method, it is preferable that the mono crystalline semiconductor base material be a bulk silicon substrate, the first mono crystalline semiconductor layer be a mono crystalline silicon germanium layer, the first polycrystalline semiconductor layer be a polycrystalline silicon germanium layer, the second mono crystalline semiconductor layer be a mono crystalline silicon layer, and the second polycrystalline semiconductor layer be a poly silicon layer.

According to this method, materials of the bulk silicon and the mono crystalline silicon layer have etching selectivity less than that of mono crystalline silicon germanium.

The mono crystalline silicon germanium layer can therefore be removed by selectively etching, leaving behind the bulk silicon and the mono crystalline silicon layer.

Thus a cavity can be easily formed between the bulk silicon and the mono crystalline silicon layer.

In the above-mentioned method, it is preferable that a layer formation condition having a selectivity be used so as to make a thickness of the polycrystalline silicon germanium layer smaller than that of the mono crystalline silicon germanium layer.

According to this method, a layer formation condition having a selectivity is used for reduction of the total amount of germanium remaining in the first polycrystalline semiconductor layer by reducing the thickness of the first polycrystalline semiconductor layer that is located under the poly silicon layer serving as an etch stop layer.

As a result, contamination caused by germanium remaining in the first polycrystalline semiconductor layer can be suppressed.

A semiconductor device is provided with a transistor using the element region made of the second mono crystalline semiconductor layer that is obtained by performing the method according to one aspect of the invention.

Accordingly, it is possible to provide a transistor for which damage caused to the element region by excessive etching or undesirable exposure of the element region caused by insufficient etching in the planarization process of a CMP method, and defects due to contamination caused by germanium remaining in the first polycrystalline semiconductor layer are suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described.

First Embodiment

FIGS. 1A through 12B are schematic views showing a method of manufacturing a semiconductor substrate according to the first embodiment of the invention.

For more details, FIGS. 1A to 12A are schematic plan views, and FIGS. 1B to 12B are schematic sectional views taken along the line A-A' of FIGS. 1A to 12A.

Figure 1A:
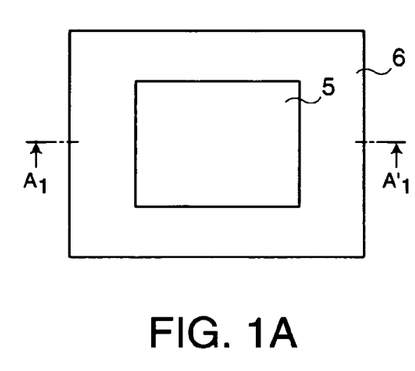
FIG. 1A is a plan view illustrating a method of manufacturing a semiconductor substrate according to a first embodiment of the invention.
Figure 1B:
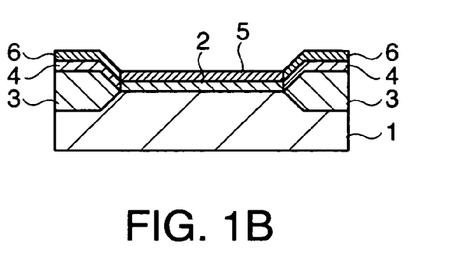
FIG. 1B is a schematic sectional view along a line A-A' of FIG. 1A.

As shown in FIGS. 1A and 1B, a mono crystalline silicon germanium layer 2 as a first mono crystalline semiconductor layer is formed in an area where mono crystalline silicon is exposed on the active surface side of a silicon substrate 1 that is a mono crystalline silicon wafer.

Simultaneously, a poly silicon germanium layer 4 as a first polycrystalline semiconductor layer is formed in an area covered with a silcion oxide layer 3 such as a LOCOS (Local Oxidation of Silicon) layer on the active surface side of the silicon substrate 1.

A mono crystalline silicon layer 5 as a second mono crystalline semiconductor layer is then formed to be placed atop the mono crystalline silicon germanium layer 2, and simultaneously a poly silicon layer 6 as a second polycrystalline semiconductor layer is formed to be placed atop the poly silicon germanium layer 4.

Here, a temperature of about 450° C., for example, may be used as a condition of forming the mono crystalline silicon germanium layer 2.

Using this condition makes it possible to significantly reduce the thickness of the poly silicon germanium layer 4 that is formed simultaneously with the mono crystalline silicon germanium layer 2.

Reducing the thickness of the poly silicon germanium layer 4 can suppress germanium contamination resulting from the poly silicon germanium layer.

Figure 2A:
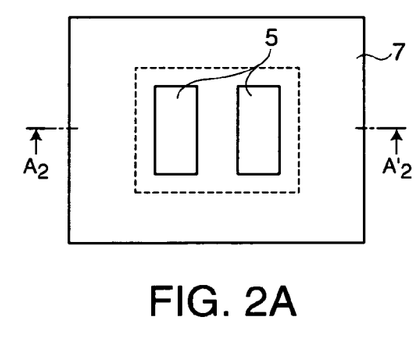
FIG. 2A is a plan view illustrating the method of manufacturing a semiconductor substrate according to the first embodiment.
Figure 2B:
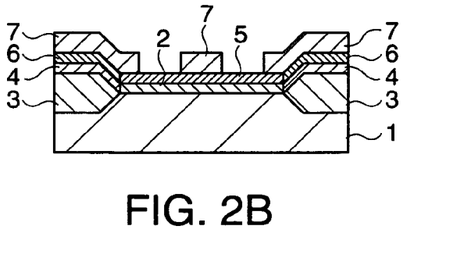
FIG. 2B is a schematic sectional view along a line A-A' of FIG. 2A.

Next, as shown in FIGS. 2A and 2B, a photo resist film 7 is patterned so as to open areas corresponding to support holes 8 (to be described later) and to cover the rest area.

At this point, patterning is performed so as to leave behind the photo resist film 7 on the poly silicon layer 6.

Figure 3A:
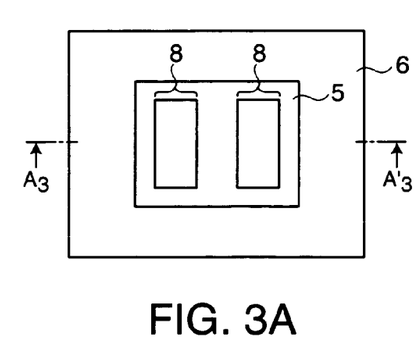
FIG. 3A is a plan view illustrating the method of manufacturing a semiconductor substrate according to the first embodiment.
Figure 3B:
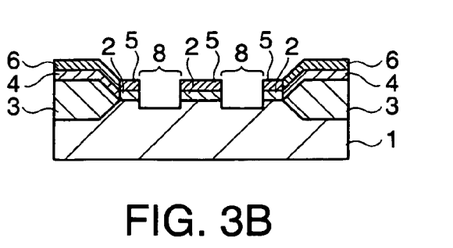
FIG. 3B is a schematic sectional view along a line A-A' of FIG. 3A.

Next, as shown in FIGS. 3A and 3B, the mono crystalline silicon layer 5 and the mono crystalline silicon germanium layer 2 are subsequently etched using the patterned photo resist film 7 as a mask to expose the surface of the silicon substrate 1.

The support holes 8 are thus formed.

After the support holes 8 have been formed, the photo resist film 7 is removed.

Figure 4A:
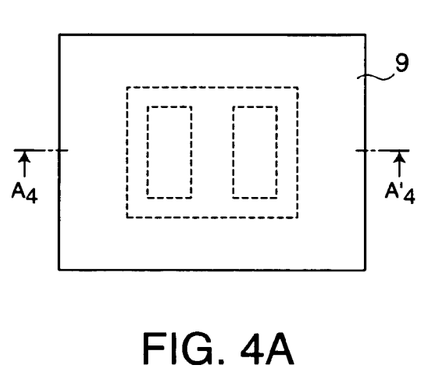
FIG. 4A is a plan view illustrating the method of manufacturing a semiconductor substrate according to the first embodiment.
Figure 4B:
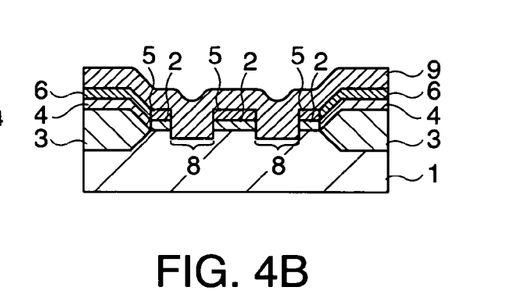
FIG. 4B is a schematic sectional view along a line A-A' of FIG. 4A.

Next, as shown in FIGS. 4A and 4B, after the photo resist film 7 has been removed, a support forming layer 9 made of silicon oxide or the like is formed over the entire surface on the active surface side of the silicon substrate 1 so as to bury the support holes 8 and to cover the mono crystalline silicon layer 5 by a method such as CVD.

Figure 5A:
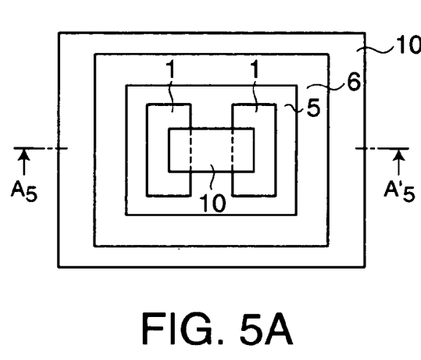
FIG. 5A is a plan view illustrating the method of manufacturing a semiconductor substrate according to the first embodiment.
Figure 5B:
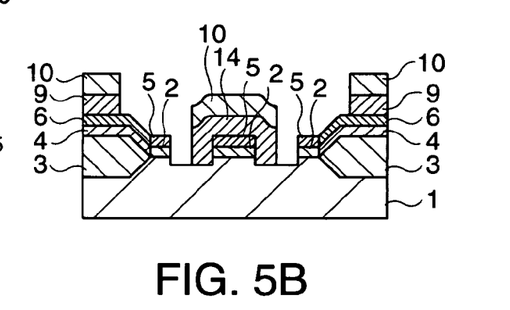
FIG. 5B is a schematic sectional view along a line A-A' of FIG. 5A.

Next, as shown in FIGS. 5A and 5B, the support forming layer 9 is etched using a patterned photo resist film 10 as a mask, forming a support 14 made of the support forming layer 9.

Here, the pattern of the photo resist film 10 is formed such that an area covering the poly silicon layer 6 and an element region 11 (to be described later), which is the mono crystalline silicon layer 5, are left when the support 14 is formed.

Figure 6A:
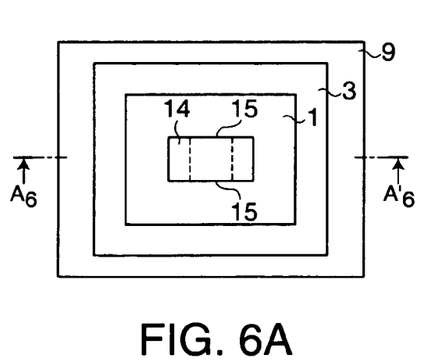
FIG. 6A is a plan view illustrating the method of manufacturing a semiconductor substrate according to the first embodiment.
Figure 6B:
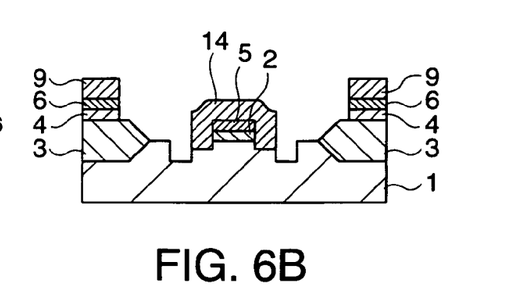
FIG. 6B is a schematic sectional view along a line A-A' of FIG. 6A.

Subsequently, as shown in FIGS. 6A and 6B, the mono crystalline silicon layer 5 and the mono crystalline silicon germanium layer 2 are etched using the photo resist film 10 as a mask to expose the silicon substrate 1 and to simultaneously expose element region sides 15.

After the etching of the mono crystalline silicon layer 5 and the mono crystalline silicon germanium layer 2 has been completed, the photo resist film 10 is removed.

Figure 7A:
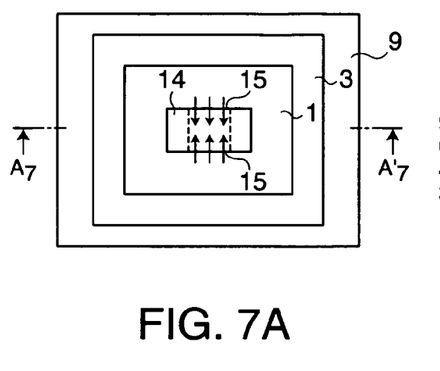
FIG. 7A is a plan view illustrating the method of manufacturing a semiconductor substrate according to the first embodiment.
Figure 7B:
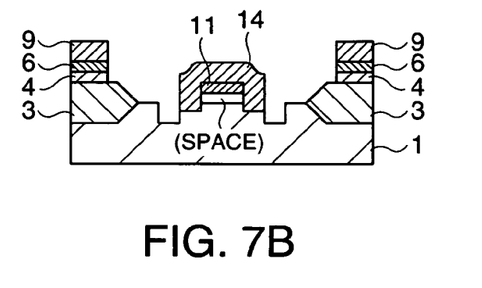
FIG. 7B is a schematic sectional view along a line A-A' of FIG. 7A.

Next, as shown in FIGS. 7A and 7B, the mono crystalline silicon germanium layer 2 is selectively etched from the element region sides 15 with an etchant having a high selectivity ratio between the mono crystalline silicon layer 5 and the mono crystalline silicon germanium layer 2, such as fluoronitric acid.

This causes the element region 11, which is the mono crystalline silicon layer 5, supported by the support 14 to be suspended.

Figure 8A:
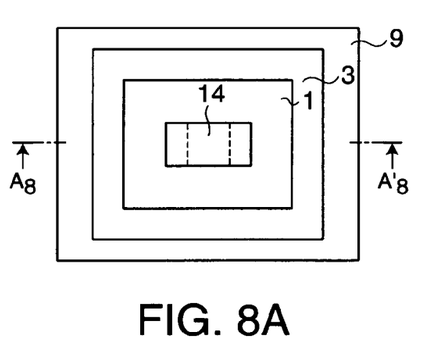
FIG. 8A is a plan view illustrating the method of manufacturing a semiconductor substrate according to the first embodiment.
Figure 8B:
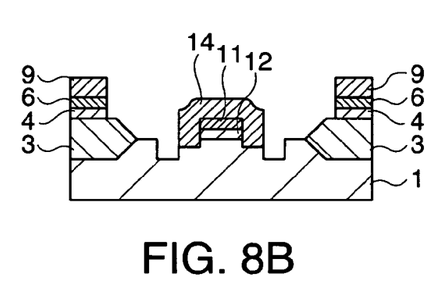
FIG. 8B is a schematic sectional view along a line A-A' of FIG. 8A.

Next, as shown in FIGS. 8A and 8B, the silicon substrate 1 is thermally oxidized, forming a buried insulating layer (BOX layer) 12 between the element region 11 and the silicon substrate 1.

The forming means is not limited to thermal oxidation of the silicon substrate 1.

It is also possible to form the buried insulating layer 12 by a CVD method or the like.

Figure 9A:
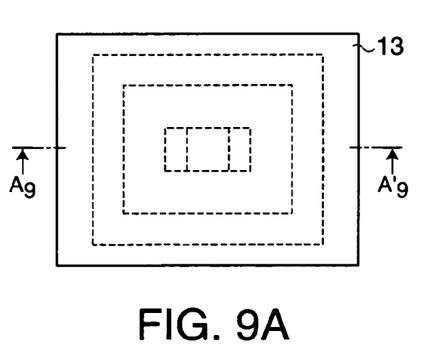
FIG. 9A is a plan view illustrating the method of manufacturing a semiconductor substrate according to the first embodiment.
Figure 9B:
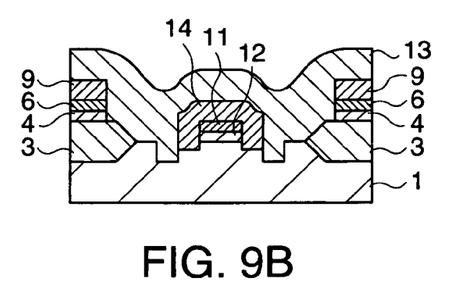
FIG. 9B is a schematic sectional view along a line A-A' of FIG. 9A.

Next, as shown in FIGS. 9A and 9B, an insulating layer 13 that is made of silicon oxide or the like and is used for isolation is formed over the entire surface on the active surface side of the silicon substrate 1 by a CVD method or the like.

Figure 10A:
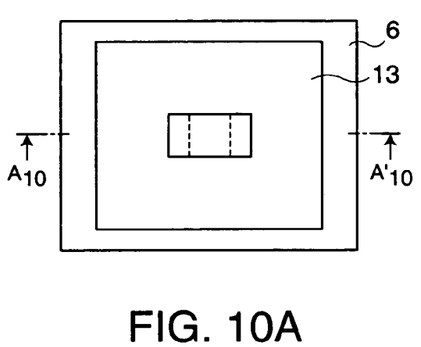
FIG. 10A is a plan view illustrating the method of manufacturing a semiconductor substrate according to the first embodiment.
Figure 10B:
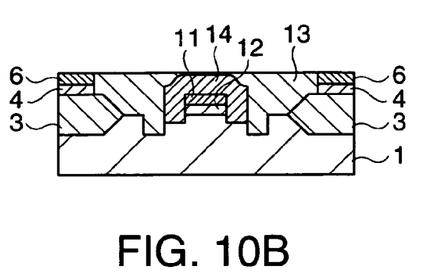
FIG. 10B is a schematic sectional view along a line A-A' of FIG. 10A.

Next, as shown in FIGS. 10A and 10B, the entire surface above the silicon substrate 1 is planarized by a CMP method.

If a CMP method is used for planarization, the etch stop layer is preferably provided.

Since the poly silicon germanium layer 4 and poly silicon layer 6 are left on the silicon oxide layer 3 as shown in FIG. 8B, etching can be performed using these layers as etch stop layers.

A portion of the support 14 remaining on the element region 11 can be of a thickness such that the top of the support 14 is approximately at the same level as the top of the poly silicon layer 6 serving as an etch stop layer.

This allows etching by CMP method to be performed with high reproducibility of remaining film thickness.

It is therefore possible to suppress damage to the element region 11 that is caused when etching by CMP method reaches the element region 11 in the case where the etching amount of the support 14 is excessive.

In contrast, if the etching amount of the support 14 is insufficient, it causes undesirable exposure of the element region 11, resulting in a portion of the silicon oxide layer remaining thereon.

The remaining portion reduces the controllability of gate oxide film thickness to cause irregularities in the transistor performance.

However, planarization etching with high controllability can be performed.

This can effectively reduce the occurrence of such a problem.

Figure 11A:
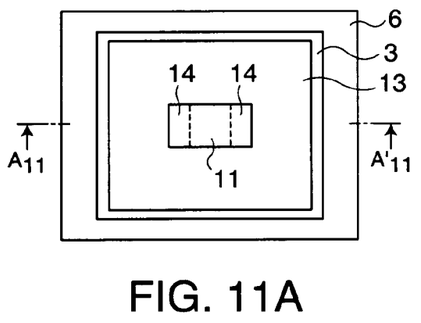
FIG. 11A is a plan view illustrating the method of manufacturing a semiconductor substrate according to the first embodiment.
Figure 11B:
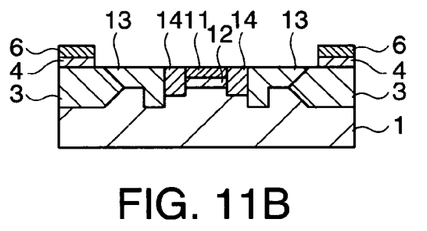
FIG. 11B is a schematic sectional view along a line A-A' of FIG. 11A.

Next, as shown in FIGS. 11A and 11B, part of the insulating layer 13 and part of the support 14 are etched with buffered fluoric acid or the like.

The element region 11 can be exposed by etching these parts to such an extent that the remaining portion of the support 14 on the element region 11 is eliminated.

This is because, in the foregoing process, the remaining portion of the support 14 on the element region 11 is of a thickness such that the top of the support 14 is approximately at the same level as the top of the poly silicon layer 6 serving as an etch stop layer.

Figure 12A:
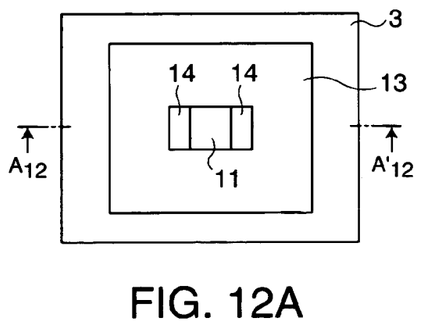
FIG. 12A is a plan view illustrating the method of manufacturing a semiconductor substrate according to the first embodiment.
Figure 12B:
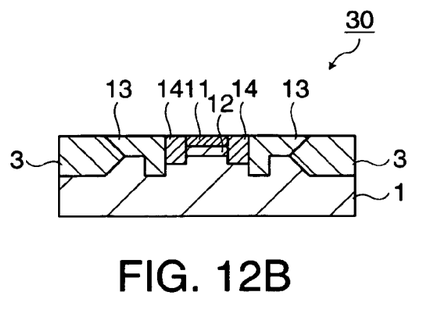
FIG. 12B is a schematic sectional view along a line A-A' of FIG. 12A.

Next, as shown in FIGS. 12A and 12B, a photo resist film (not shown) is formed to cover the surface on the active surface side of the silicon substrate 1, which is a bulk silicon wafer, except for an area where the poly silicon germanium layer 4 or the poly silicon layer 6 is formed, and the poly silicon germanium layer 4 and the poly silicon layer 6 are removed by etching.

Subsequently, the photo resist film (not shown) is removed, thus completing a semiconductor substrate 30.

As described above, in this method of manufacturing the semiconductor substrate 30, planarization etching can be performed using the poly silicon germanium layer 4 or the poly silicon layer 6 as etch stop layers since these layers are left on the silicon oxide layer 3.

It is therefore possible to suppress damage to the element region 11 caused when etching by CMP method reaches the SOI layer in the case where the etching amount is excessive.

It is also possible to effectively suppress the irregularities in the transistor performance caused by reduction of the controllability of gate oxide film thickness.

The reduction is caused by the remaining portion of the silicon oxide layer on the element region 11 in the case where the etching amount is insufficient.

In addition, using a temperature of about 450° C. as a condition of forming the mono crystalline silicon germanium layer 2 can substantially reduce the thickness of the poly silicon germanium layer 4 that is formed simultaneously with the mono crystalline silicon germanium layer 2.

Reducing the thickness of the poly silicon germanium layer 4 enables suppression of germanium contamination resulting from the poly silicon germanium layer 4.

If germanium is incorporated in the element region 11, for example, in the case of forming a gate insulating film of a transistor on the element region 11, germanium is concentrated in the gate insulating film in such a manner that germanium is pushed out to the interface among the element region 11, the gate insulating film and silicon.

This may cause problems such as leakage current, Qbd degradation and decreased mobility.

However, the use of the above-described manufacturing method of the semiconductor substrate 30 can provide a manufacturing method of a semiconductor substrate that can reduce the occurrence of problems caused by germanium contamination.

Second Embodiment

Next, a transistor as a semiconductor device will be described as the second embodiment of the invention.

Figure 13A:
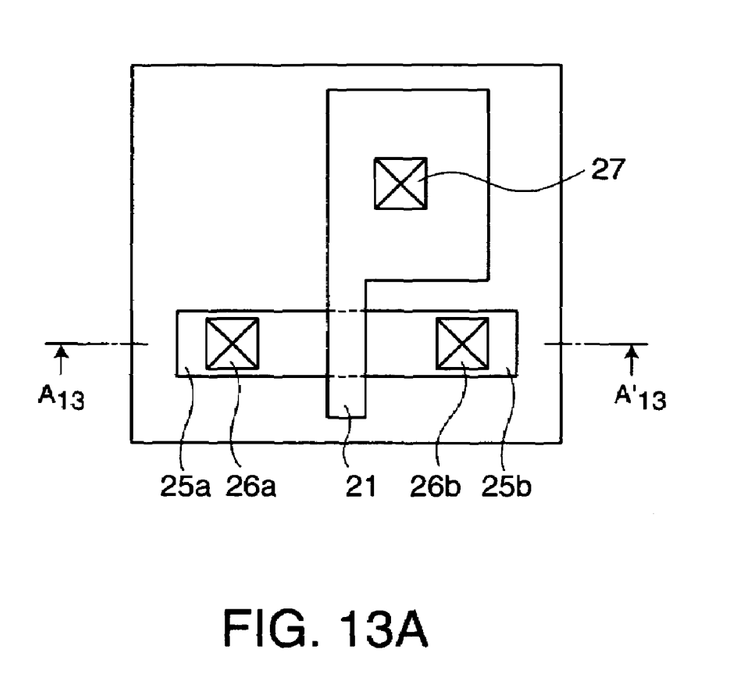
FIG. 13A is a plan view illustrating a semiconductor device according to a second embodiment of the invention.
Figure 13B:
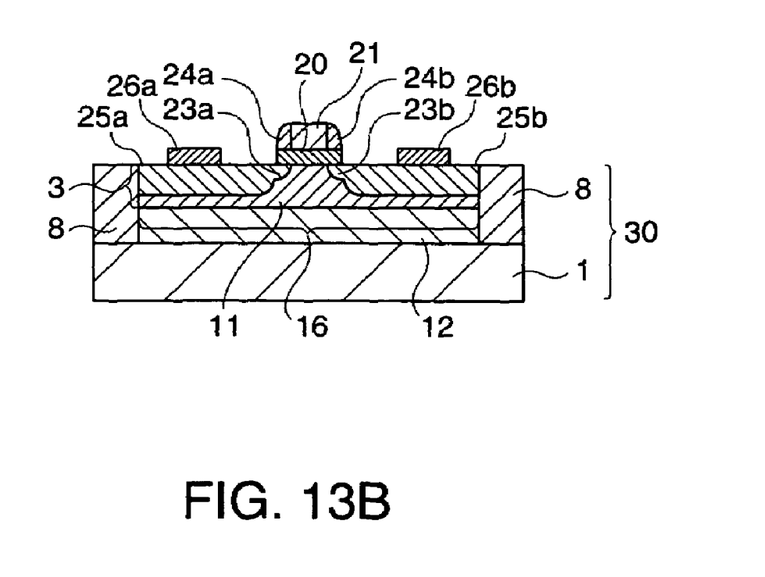
FIG. 13B is a schematic sectional view along a line A-A' of FIG. 13A.

A transistor 16 as a semiconductor device is formed as shown in FIGS. 13A and 13B by using the SOI structure shown in FIGS. 12A and 12B.

The manufacturing processes will be briefly described below.

Thermal oxidation of the surface of the element region 11 is performed to form a gate insulating film 20 on the surface of the element region 11.

Next, a poly silicon layer is formed on the element region 11 with the gate insulating film 20 therebetween by a CVD method or the like.

The poly silicon layer is then patterned using a photolithography technique, forming a gate electrode 21 on the gate insulating film 20.

Next, an impurity such as As, P or B is ion implanted into the element region 11 by using the gate electrode 21 as a mask, so that LDD (lightly doped drain) layers 23a and 23b, which are lightly impurity-doped layers, are formed to be located within the element region 11 at both sides of the gate electrode 21.

An insulating layer is formed over the element region 11 with the LDD layers 23a and 23b, and then is etched back using dry etching such as RIE (Reactive Ion Etching), thereby forming side walls 24a and 24b on both sides of the gate electrode 21.

By ion implanting an impurity such as As, P or B into the element region 11 by using the gate electrode 21 and the side walls 24a and 24b as masks, source/drain layers 25a and 25b, which are heavily impurity-doped layers, are formed to be located within the element region 11 proximate the side walls 24a and 24b.

Contacts 26a, 26b and 27 are then provided.

Thus the transistor 16 as a semiconductor device is completed on the semiconductor substrate 30 of SOI structure.

For the above-described transistor 16 as a semiconductor device on the semiconductor substrate 30, planarization etching is performed using as the etch stop layer the poly silicon germanium layer 4 or the poly silicon layer 6 left on the silicon oxide layer 3.

The remaining portion of the support 14 on the element region 11 can be of a thickness such that the top of the support 14 is approximately at the same level as the top of the poly silicon layer 6 serving as the etch stop layer.

This allows etching by CMP method to be performed with high reproducibility of remaining film thickness.

It is therefore possible to suppress damage to the element region 11 caused when etching by CMP method reaches the element region 11 in the case where the etching amount of the support 14 is excessive.

It is also possible to effectively suppress the irregularities in transistor performance caused by reduced controllability of gate oxide film thickness.

The controllability is reduced by the remaining portion of the silicon oxide layer in the channel of the transistor 16, which occurs in the case where the etching amount of the support 14 is insufficient.

Using a temperature of about 450° C., for example, as a condition of forming the mono crystalline silicon germanium layer 2 can substantially reduce the thickness of the poly silicon germanium layer 4 that is formed simultaneously with the mono crystalline silicon germanium layer 2.

Reducing the thickness of the poly silicon germanium layer 4 enables suppression of germanium contamination resulting from the poly silicon germanium layer 4.

Since incorporation of germanium in the element region 11 is prevented as described in the first embodiment, it is possible to provide a transistor as a high-quality semiconductor element in which the occurrence of problems such as leakage current, Qbd degradation and decreased mobility is reduced.

Although silicon is used as a material of the semiconductor base in the description of the embodiments of the invention, other materials such as Ge, SiGe, SiC, SiSn, PbS, GaAs, InP, GaP, GaN and ZnSe may be used.

Although description is given taking silicon germanium as an example of the material of the first semiconductor layer and silicon as an example of the material of the second semiconductor layer in the embodiments of the invention, the materials may be combined such that the second semiconductor layer is made of a material having an etching selectivity less than that of a material of the first semiconductor layer.

For example, combinations selected from Ge, SiC, SiSn, PbS, GaAs, InP, GaP, GaN, ZnSe and the like may be used as materials of the first and second semiconductor layers.

What is claimed is:

1. A method of manufacturing a semiconductor substrate, comprising:

forming a first mono crystalline semiconductor layer in a portion having a mono crystalline area exposed on an active surface side of a mono crystalline semiconductor base material, the first mono crystalline semiconductor layer being made of a mono crystalline material having an etching selectivity greater than an etching selectivity of the semiconductor base material, and simultaneously forming a first polycrystalline semiconductor layer in a portion where a coated material has been formed in the mono crystalline area, the first polycrystalline semiconductor layer being made of a polycrystalline material;

forming a second mono crystalline semiconductor layer in an area covering the first mono crystalline semiconductor layer, the second mono crystalline semiconductor layer being made of a mono crystalline material having an etching selectivity greater than an etching selectivity of the material of the first mono crystalline semiconductor layer, and simultaneously forming a second polycrystalline semiconductor layer in an area covering the first polycrystalline semiconductor layer, the second polycrystalline semiconductor layer being made of a polycrystalline material;

forming a support hole exposing the semiconductor base by partially removing and opening the second mono crystalline semiconductor layer and the first mono crystalline semiconductor layer located in vicinity of an element region formed of part of the second mono crystalline semiconductor layer;

forming a support forming layer on the active surface side of the semiconductor base material so as to fill the support hole and the element region and to cover the second polycrystalline semiconductor layer;

performing etching, leaving behind at least part of the second polycrystalline semiconductor layer serving as an etch stop layer, and the support hole and the element region, thereby forming an opening surface to expose the support and part of an end of the first mono crystalline semiconductor layer and part of an end of the second mono crystalline semiconductor layer, the first mono crystalline semiconductor layer and the second mono crystalline semiconductor layer being positioned between the semiconductor base material and the support;

forming a cavity between the second mono crystalline semiconductor layer constituting the element region and the semiconductor base material by selectively etching the first mono crystalline semiconductor layer through the opening surface;

forming a buried insulating layer in the cavity;

forming a planarizing insulating layer on the active surface side of the semiconductor base material;

planarizing the active surface side of the semiconductor base material using the second polycrystalline semiconductor layer as an etch stop layer and thereafter exposing the second mono crystalline semiconductor layer; and removing the second polycrystalline semiconductor layer and the first polycrystalline semiconductor layer.

2. The method according to claim 1, wherein a method of the planarizing is a CMP (chemical-mechanical polishing) method and uses the second polycrystalline semiconductor layer as an etch stop layer.

3. The method according to claim 1, wherein the mono crystalline semiconductor base material is a bulk silicon substrate, the first mono crystalline semiconductor layer is a mono crystalline silicon germanium layer, the first polycrystalline semiconductor layer is a polycrystalline silicon germanium layer, the second mono crystalline semiconductor layer is a mono crystalline silicon layer, and the second polycrystalline semiconductor layer is a poly silicon layer.

4. The method according to claim 3, wherein a layer formation condition having a selectivity is used so as to make a thickness of the polycrystalline silicon germanium layer smaller than a thickness of the mono crystalline silicon germanium layer.

5. A semiconductor device provided with a transistor using the element region made of the second mono crystalline semiconductor layer obtained by performing the method according to claim 1.

* * * * *